United States Patent
Shimada et al.

(12) 
(10) Patent No.: US 6,413,896 B1
(45) Date of Patent: Jul. 2, 2002

(54) METHOD FOR PRODUCING DIELECTRIC PORCELAIN COMPOSITION FOR ELECTRONIC DEVICE

(75) Inventors: Takeshi Shimada; Kazuhiro Nishikawa, both of Kyoto; Kazuya Toji, Osaka, all of (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/701,931

(22) PCT Filed: Jun. 4, 1999

(86) PCT No.: PCT/JP99/03026
§ 371 (c)(1),
(2), (4) Date: Dec. 6, 2000

(87) PCT Pub. No.: WO99/67186
PCT Pub. Date: Dec. 29, 1999

(30) Foreign Application Priority Data

Jun. 22, 1998 (JP) ............................................. 10-192357

(51) Int. Cl.$^7$ ............................................. C04B 35/00
(52) U.S. Cl. ........................................ 501/135; 501/134
(58) Field of Search .................................. 501/135, 134

(56) References Cited

U.S. PATENT DOCUMENTS 6,117,806 A * 9/2000 Yokoi et al. ................. 501/135
6,331,498 B1 * 12/2000 Shimada et al. ............. 501/135

* cited by examiner

*Primary Examiner*—C. Melissa Koslow
(74) *Attorney, Agent, or Firm*—Dykema Gossett PLLC

(57) ABSTRACT

A method for producing $X(Ba_Z.Sr_{1-Z})(Zn_{1/3}.(Ta_M.Nb_{1-M})_{2/3})O_3$—$Y(Ba_Z.Sr_{1-Z})(Ga_{1/2}.Ta_{1/2})O_3$ solid solution system, characterized in that sintering is carried out at a temperature of 1400° C. to 1550° C. in an atmosphere of $N_2$ containing oxygen in a concentration of 6% to 40% or sintering is carried out at a temperature of 1400° C. to 1550° C. after presintering at a temperature of 900° C. to 1300° C. This method is suitably used in order to constantly produce a dielectric porcelain composition for an electronic device which has a reduced temperature coefficient of resonance frequency and an excellent specific dielectric constant, and is uniform with respect to the quality distribution in one composition, by suppressing the evaporation of the Zn contained in a conventional porcelain composition of a perovskite type compound and adjusting the oxygen concentration in an atmosphere for sintering to a specific value without controlling a composition.

2 Claims, No Drawings

METHOD FOR PRODUCING DIELECTRIC PORCELAIN COMPOSITION FOR ELECTRONIC DEVICE

TECHNICAL FIELD

The present invention relates to improvements in methods of manufacturing dielectric ceramic compositions for electronic devices, and in particular, to a method of manufacturing dielectric ceramic compositions for electronic devices comprising composite perovskite type compounds utilized in the SHF band whereby a ceramic is obtained of internally uniform properties, in particular of excellent temperature coefficient and sintering ability, by controlling the coupling conditions of metallic ions and oxygen ions in the composition by using a specific content of the oxygen concentration in the sintering atmosphere.

BACKGROUND ART

Dielectric ceramic compositions for electronic devices of various types are utilized on account of their low loss characteristics and excellent temperature characteristics. There are various types of such dielectric ceramic compositions, which are used in particular for temperature compensating capacitors and in dielectric resonators or strip line cards for microwave device etc for satellite broadcasting and reception and for down-conversion, utilizing their low loss in the SHF band.

In general, as dielectric ceramic compositions employed for the SHF band, conventional perovskite compounds which were widely employed included composite perovskite compounds in particular $Ba(B_{1/3} \cdot A_{2/3})O_3$ compositions (where A is Ta and B is a divalent metallic ion (Zn or Ni, Co, Mn)), specifically $Ba(Zn_{1/3} \cdot Ta_{2/3})O_3$ materials.

The characteristics such as high $\epsilon r$, high Q and $\tau f=0$ that are required for the dielectric ceramic compositions used in this SHF band are tightly specified and composition control in order to match such characteristics that are needed by materials capable of f control is extremely important; for this purpose, prolonged sintering and complex adjustment of constituents was necessary.

In conventional dielectric ceramic compositions, composition control, in particular, since the Zn contained in the aforesaid composition easily evaporates, control of Zn, is extremely important. Also, on sintering, the Zn diffuses to the outer surface of the ceramics and is volatilized, tending to form a so-called "skin" due to the formation of Zn-deficient constituents, such as $Ba_5Ta_4O_{15}$. Thus, it was difficult to obtain internally uniform ceramics in stable fashion, so it was difficult to obtain ceramics of stable characteristics.

Also, depending on the application, it was necessary to adjust to a prescribed resonance frequency temperature coefficient $\tau f$; however, it was known that the $Ba(Zn_{1/3} \cdot Ta_{2/3})O_3$ material has a $\tau f$ in the vicinity of zero.

Previously, as a result of various investigations of the aforesaid $Ba(Zn_{1/3} \cdot Ta_{2/3})O_3$ etc composition aimed at eliminating the drawbacks of the aforesaid composite perovskite compounds and controlling the Zn in the dielectric ceramic composition, by controlling the Zn to a prescribed value in the composition by the inclusion of specific trivalent metallic ions, as ceramics of internal uniformity with excellent characteristics and excellent sintering capability, $XBa(Zn_{1/3} \cdot Ta_{2/3})O_3$—$YSr(Ga_{1/2} \cdot Ta_{1/2})O_3$ solid solutions and $XBa(Zn_{1/3} \cdot Ta_{2/3})O_3$—$Y(Ba_Z \cdot Sr_{1-Z})(Ga_{1/2} \cdot Ta_{1/2})O_3$ solid solutions have been proposed (Laid-open Japanese Patent Application No. H. 2-285616, Laid-open Japanese Patent Publication No. H. 3-232751).

In recent years, with miniaturization of electronic devices and the shift of frequency bands in the communications field to high frequency bands, the drawback has been experienced that it has been necessary to make dielectric elements of large size, owing to the low dielectric constant of conventional dielectric ceramic compositions.

DISCLOSURE OF THE INVENTION

In view of the foregoing situation regarding conventional composite perovskite compounds, an object of the present invention is to provide a method of manufacturing a dielectric ceramic composition for electronic devices whereby an internally uniform ceramic composition of excellent relative permittivity can be obtained in a stable fashion by controlling the temperature coefficient of the resonance frequency, by adjusting the oxygen concentration of the sintering atmosphere to a specific content, without adjusting the composition, by suppressing evaporation of Zn contained in the ceramic composition.

Aiming at solving the above problems of the prior art, the present inventors discovered that the dielectric constant of a system in which some of the Ta in the foregoing $Ba(Zn_{1/3} \cdot Ta_{2/3})O_3$ solid solution system was substituted by Nb, i.e. an $XBa(Zn_{1/3} \cdot (Ta_M \cdot Nb_{1-M})_{2/3})O_3$—$Y(Ba_Z \cdot Sr_{1-Z})(Ga_{1/2} \cdot Ta_{1/2})O_3$ solid solution system was increased, and the Ga in a $YSr(Ga_{1/2} \cdot Ta_{1/2})O_3$ solid solution system was effective in improving sintering facility.

However, although the molding was cooled with a cooling rate of 250° C./Hr to room temperature after holding for 30 minutes to 96 hours at 1400° C. to 1550° C. after heating to 1400° C. to 1550° C. with a rate of temperature rise of 250° C./Hr in an atmosphere of $O_2$ concentration of 70% or higher, the drawback was experienced of a considerable fall in relative permittivity when the temperature coefficient of resonance frequency was controlled to a low value by adjustment of the composition of this solid solution ceramic composition.

However, as a result of various investigations aimed at preventing this drop in relative permittivity of the solid solution system, the inventors discovered that the temperature coefficient of resonance frequency could be controlled and the drop in relative permittivity restricted to a minimum by, instead of adjusting the composition of the solid solution system, adjusting the oxygen concentration in the sintering atmosphere to a specific content, and in this way perfected the present invention.

Specifically, when manufacturing a dielectric ceramic composition for electronic devices consisting of a composition expressed by the basic composition $X(Ba_Z \cdot Sr_{1-Z})(Zn_{1/3}(Ta_M Nb_{1-M})_{2/3})O_3$—$Y(Ba_{Z'} \cdot Sr_{1-Z'})(Ga_{1/2} \cdot Ta_{1/2})O_3$ wherein X, Y, Z, Z' and M that define the composition ranges satisfy the following values, the present invention consists in a method of manufacturing a dielectric ceramic composition for electronic devices wherein sintering is performed at 1400° C. to 1550° C. or sintering is performed at 1400° C. to 1550° C. after pre-sintering at 900° C. to 1300° C. in an $N_2$ atmosphere containing an oxygen concentration of 6% to 40%:

$X+Y=1$, $0.3 \leq X \leq 1$, $0.7 \geq Y \geq 0$, $0 \leq Z \leq 1$, $0 \leq Z' \leq 1$, $0.2 \leq M \leq 0.8$.

BEST MODE FOR CARRYING OUT THE INVENTION

According to the present invention, $BaCO_3$, $SrCO_3$, ZnO, $Ta_2O_5$, $Nb_2O_5$, $Ga_2O_3$ powder of grain size of 1 μm or less are blended and mixed so as to form a composition $X(Ba_Z.Sr_{1-Z})(Zn_{1/3}(Ta_M.Nb_{1-M})_{2/3})O_3$—$Y(Ba_{Z'}.Sr_{1-Z'})(Ga_{1/2}.Ta_{1/2})O_3$ (X+Y=1, $0.3 \leq X \leq 1$, $0.7 \geq Y \geq 0$, $0 \leq Z \leq 1$, $0 \leq Z' \leq 1$, $02 \leq M \leq 0.8$), then dried and calcined in air or an oxygen or $N_2$ atmosphere at 1000° C. to 1200° C., then pulverized and granulated, uniaxially pressure-molded, or molded under hydrostatic pressure, then subjected to removal of binder, and heated with a rate of rise of temperature of 50° C./hour to 300° C./hour in an $N_2$ atmosphere of oxygen concentration adjusted to 6% to 40%, and sintered by holding for 30 minutes to 96 hours at 1400° C. to 1550° C., then cooled with a cooling rate of 50° C./hour to 300° C./hour to room temperature.

In the present invention, pre-sintering for 30 minutes to 96 hours at 900° C. to 1300° C. allows $O_2$ gas in the sintering atmosphere to penetrate into pores of the molding and so is effective in promoting fineness of the sintered body.

Reasons for the restrictions in the composition

The reasons for the restrictions of X, Y in the compositional formula in the present invention to $0.3 \leq X \leq 1$, $0.7 \geq Y \geq 0$ are that if X is less than 0.3 or Y exceeds 0.7, the Qf of the dielectric ceramic composition obtained is severely adversely affected, the frequency temperature coefficient departs considerably from 0 ppm/° C., the improvement in sintering capability disappears, and it becomes impossible to control the temperature coefficient of frequency.

Also, by keeping Z and Z' in a range 0 to 1, the resonance frequency temperature coefficient if can be selected at will in the range +4.0 to −2.0 ppm/° C.

Further, by keeping M in the range 0.2 to 0.8, the dielectric coefficient can be selected between 29 and 35, making it possible to match the size and coupling of various types of filter and/or electronic device. If M is less than 0.2, the temperature coefficient of frequency departs considerably from zero and if it exceeds 0.8 no improvement in the dielectric constant is seen.

The reason for restricting the concentration of $O_2$ in the sintering atmosphere according to the present invention to 6% to 40% is that, under 6%, τf becomes low and the dielectric constant is excessively lowered, which is undesirable, and if it exceeds 40%, although this is desirable in terms of an improvement in the dielectric coefficient, τf becomes high and furthermore the Qf value falls, so this is also undesirable.

The reasons for restricting the pre-sintering temperature according to the invention to 900° C. to 1300° C. are that the molding becomes of largest size, due to thermal expansion, at 900° C. to 1300° C., enabling the oxygen and $N_2$ to permeate to a fully sufficient extent into the interior of the molding. Outside this temperature range, permeation of $O_2$ and $N_2$ is incomplete, lowering the benefits thereof. If the pre-sintering time is less than 30 minutes, $O_2$ and $N_2$ cannot permeate into the middle of the molding and if it is more than 96 hours, evaporation of other constituents be comes severe, which is undesirable.

Also, the reason for restricting the sintering temperature to 1400° C. to 1550° C. is that if it is less than 1400° C. sufficient fineness is not achieved and the dielectric constant becomes too high, while if it is more than 1550° C., this causes deterioration of properties due to evaporation of Zn, which is undesirable. The reason for restricting the rate of rise of temperature to 50° C./hour to 300° C./hour is that, at less than 50° C./hour, the total sintering time becomes too long, allowing constituents such as Zn to evaporate; if it is more than 300° C./hour, cracks are produced in the sintered body, which is undesirable. The pre-sintering and sintering may be performed in the same pattern.

According to the invention, practically the same benefits may be obtained by substituting up to about 20 mol% of the Zn by divalent metal ions such as $Ni^{2+}$, $Co^{2+}$, or $Mn^{2+}$ or alkaline earth ions such as $Ca^{2+}$, or $M^{2+}$.

EXAMPLES

Example 1

The raw materials were weighed out to the compositions shown in Table 1 to Table 3, mixed and blended in a ball mill and calcined for two hours at 1200° C., after which the mixture was again pulverized to mean grain size of 1 μm using the ball mill. This pulverized powder was molded under pressure, then raised in temperature at a rate of 250° C./Hr in an $N_2$ atmosphere having the $O_2$ concentrations shown in Table 1 and Table 2, then sintered under the sintering conditions shown in Table 1 and Table 2, to obtain sintered bodies of dimensions 10 mmφ×22 mm.

The sintered bodies obtained were cut to a thickness of 4.5 mm and 9.0 mm and their relative permittivity εr, Qf, and temperature coefficient of resonance frequency τf (ppm/° C.) were respectively measured at 25° C. and 9 GHz. The results are shown in Table 1 and Table 2.

The relative permittivity and Qf in Table 1 were measured by the dielectric resonator method of Hakki and Celeman. The temperature coefficient τf of resonance frequency, the dielectric constant, and temperature coefficient τε of the dielectric constant are related to the linear thermal expansion coefficient α of the ceramic by the following expression:

$$\tau f = -\tfrac{1}{2}\tau\epsilon - \alpha$$

Example 2

Using the raw material powders of the compositions shown in Table 1 and Table 2 of Example 1, molding was performed under pressure, and the product raised in temperature at a rate of temperature rise of 250° C./Hr in an $N_2$ atmosphere having the $O_2$ concentrations shown in Table 3 and Table 4. Pre-sintering was then performed under the pre-sintering conditions shown in Table 3 and Table 4, followed by sintering under the sintering conditions are shown in Table 3 and Table 4, to manufacture sintered bodies of the same dimensions as in Example 1. The sintered bodies obtained were cut to thicknesses of 4.5 mm and 9.0 mm and their relative permittivity εr, Qf, and temperature coefficient τf (ppm/° C.) of resonance frequency were measured in the same way as in Example 1. The results are shown in Table 3 and Table 4.

TABLE 1

$Ba(Zn_{1/3}(Ta_{0.6}.Nb_{0.4})_{2/3})O_3$

| | | Sintering conditions | | Properties | | |
|---|---|---|---|---|---|---|
| | | Sintering atmosphere $O_2$ concentration | Sintering temperature (° C.) | Relative permittivity $\epsilon r$ | Qf (GHz) | Temperature coefficient $\tau f$ (ppm/° C.) |
| Present invention | | | | | | |
| | 1 | 6.3 | 1500 | 33.5 | 85250 | 3.0 |
| | | | 1550 | 33.6 | 85013 | 2.9 |
| | 2 | 18.3 | 1500 | 33.6 | 81623 | 3.1 |
| | | | 1550 | 33.7 | 80881 | 3.0 |
| | 3 | 28.0 | 1500 | 33.6 | 60577 | 2.9 |
| | | | 1550 | 33.8 | 63571 | 2.9 |
| | 4 | 37.0 | 1500 | 33.7 | 60012 | 2.9 |
| | | | 1550 | 33.8 | 60053 | 3.0 |
| Comparison | | | | | | |
| | 5 | 52.5 | 1500 | 33.7 | 40312 | 3.2 |
| | | | 1550 | 34.0 | 41333 | 4.1 |
| | 6 | 80.5 | 1500 | 33.9 | 38560 | 3.8 |
| | | | 1550 | 34.2 | 37161 | 4.0 |

TABLE 2

$0.93Ba(Zn_{1/3}(Ta_{0.5}.Nb_{0.5})_{2/3})O_3 - 0.07Ba(Ga_{1/2}.Ta_{1/2})O_3$

| | | Sintering conditions | | Properties | | |
|---|---|---|---|---|---|---|
| | | Sintering atmosphere $O_2$ concentration | Sintering temperature (° C.) | Relative permittivity $\epsilon r$ | Qf (GHz) | Temperature coefficient $\tau f$ (ppm/° C.) |
| Present invention | | | | | | |
| | 7 | 6.3 | 1500 | 33.5 | 91430 | 3.1 |
| | | | 1550 | 33.5 | 89213 | 3.0 |
| | 8 | 18.3 | 1500 | 33.5 | 81262 | 1.0 |
| | | | 1550 | 33.5 | 85814 | 1.2 |
| | 9 | 28.0 | 1500 | 33.5 | 61755 | −0.1 |
| | | | 1550 | 33.7 | 63589 | 0.3 |
| | 10 | 37.0 | 1500 | 33.6 | 50072 | 0.7 |
| | | | 1550 | 33.9 | 52113 | 0.5 |
| Comparison | | | | | | |
| | 11 | 52.5 | 1500 | 33.8 | 41611 | 1.7 |
| | | | 1550 | 34.0 | 40327 | 2.6 |
| | 12 | 80.5 | 1500 | 34.4 | 41683 | 4.0 |
| | | | 1550 | 34.4 | 39998 | 3.8 |

TABLE 3

$Ba(Zn_{1/3}(Ta_{0.5}.Nb_{0.5})_{2/3})O_3$

| | | Sintering conditions | | | Properties | | |
|---|---|---|---|---|---|---|---|
| | | Sintering atmosphere $O_2$ concentration | Pre-sintering temperature (° C.) | Sintering temperature (° C.) | Relative permittivity $\epsilon r$ | Qf (GHz) | Temperature coefficient $\tau f$ (ppm/° C.) |
| Present invention | 13 | 6.3 | 1000 | 1500 | 33.5 | 81358 | 2.1 |
| | 14 | | 1100 | | 33.5 | 83263 | 0.9 |
| | 15 | | 1200 | | 33.5 | 86212 | 2.8 |
| | 16 | | 1300 | | 33.6 | 87751 | 2.6 |
| | 17 | 18.3 | 1000 | 1500 | 33.5 | 84514 | 2.4 |
| | 18 | | 1100 | | 33.5 | 80104 | 2.6 |
| | 19 | | 1200 | | 33.6 | 90028 | 2.5 |

TABLE 3-continued $Ba(Zn_{1/3}(Ta_{0.5}.Nb_{0.5})_{2/3})O_3$

| | | Sintering conditions | | | Properties | | |
|---|---|---|---|---|---|---|---|
| | | Sintering atmosphere $O_2$ concentration | Pre-sintering temperature (° C.) | Sintering temperature (° C.) | Relative permittivity $\epsilon r$ | Qf (GHz) | Temperature coefficient $\tau f$ (ppm/° C.) |
| | 20 | | 1300 | | 33.6 | 82016 | 2.5 |
| | 21 | 28.0 | 1000 | 1500 | 33.5 | 91001 | 2.0 |
| | 22 | | 1100 | | 33.5 | 87201 | 2.5 |
| | 23 | | 1200 | | 33.6 | 84997 | 2.6 |
| | 24 | | 1300 | | 33.5 | 90421 | 2.8 |
| | 25 | 37.0 | 1000 | 1500 | 33.6 | 83264 | 1.9 |
| | 26 | | 1100 | | 33.7 | 86617 | 2.0 |
| | 27 | | 1200 | | 33.7 | 89969 | 3.1 |
| | 28 | | 1300 | | 33.9 | 91382 | 3.5 |
| Comparison | 29 | 52.5 | 1000 | 1500 | 33.8 | 80235 | 3.6 |
| | 30 | | 1100 | | 33.9 | 79128 | 3.7 |
| | 31 | | 1200 | | 34.0 | 52133 | 2.9 |
| | 32 | | 1300 | | 34.0 | 61217 | 3.7 |
| | 33 | 80.5 | 1000 | 1500 | 34.0 | 51139 | 2.9 |
| | 34 | | 1100 | | 34.3 | 40032 | 3.8 |
| | 35 | | 1200 | | 34.5 | 39821 | 3.9 |
| | 36 | | 1300 | | 34.8 | 40868 | 4.2 |

TABLE 4

$0.93Ba(Zn_{1/3}(Ta_{0.5}.Nb_{0.5})_{2/3})O_3 - 0.07Ba(Ga_{1/2}.Ta_{1/2})O_3$

| | | Sintering conditions | | | Properties | | |
|---|---|---|---|---|---|---|---|
| | | Sintering atmosphere $O_2$ concentration | Pre-sintering temperature (° C.) | Sintering temperature (° C.) | Relative permittivity $\epsilon r$ | Qf (GHz) | Temperature coefficient $\tau f$ (ppm/° C.) |
| Present invention | 37 | 6.3 | 1000 | 1500 | 33.5 | 92478 | 3.1 |
| | 38 | | 1100 | | 33.6 | 85524 | 2.1 |
| | 39 | | 1200 | | 33.7 | 83261 | 1.2 |
| | 40 | | 1300 | | 33.7 | 85513 | 3.1 |
| | 41 | 18.3 | 1000 | 1500 | 33.5 | 82212 | 0.4 |
| | 42 | | 1100 | | 33.6 | 82884 | 1.8 |
| | 43 | | 1200 | | 33.6 | 86489 | 1.8 |
| | 44 | | 1300 | | 33.8 | 91283 | 1.8 |
| | 45 | 28.0 | 1000 | 1500 | 33.5 | 62865 | −0.2 |
| | 46 | | 1100 | | 33.6 | 58708 | 1.8 |
| | 47 | | 1200 | | 33.6 | 68027 | −0.3 |
| | 48 | | 1300 | | 33.6 | 43816 | 3.3 |
| | 49 | 37.0 | 1000 | 1500 | 33.7 | 51652 | 0.8 |
| | 50 | | 1100 | | 33.8 | 60574 | 1.8 |
| | 51 | | 1200 | | 33.9 | 46797 | 3.0 |
| | 52 | | 1300 | | 33.9 | 42383 | 3.2 |
| Comparison | 53 | 52.5 | 1000 | 1500 | 33.9 | 41684 | 1.6 |
| | 54 | | 1100 | | 34.1 | 41352 | 3.5 |
| | 55 | | 1200 | | 34.2 | 98222 | 2.4 |
| | 56 | | 1300 | | 34.2 | 47136 | 2.9 |
| | 57 | 80.5 | 1000 | 1500 | 34.5 | 42684 | 4.4 |
| | 58 | | 1100 | | 34.8 | 41338 | 2.5 |
| | 59 | | 1200 | | 34.7 | 48240 | 2.8 |
| | 60 | | 1300 | | 35.0 | 41846 | 2.9 |

INDUSTRIAL APPLICABILITY

With a dielectric ceramic composition according to the present invention, the Qf at 7 to 8 GHz is 42,000 GHz to 93,000 GHz, −0.35 ppm/° C.<$\tau f$<+3.5 ppm/° C., and $\epsilon r$ is 33.5 to 33.9. Thus, properties superior to conventional dielectric ceramic compositions are obtained. Even on sintering, evaporation of the Zn contained in the ceramic composition is suppressed, facilitating control of the composition. Also, segregation of Zn in the ceramic can easily be prevented so an internally uniform ceramic is obtained in stable fashion, which is of excellent sintering capability and can be manufactured in a short time. Furthermore, in particular, the temperature coefficient of resonance frequency can be controlled and the drop in relative permittivity can be reduced to a minimum without needing to perform adjustment of the composition.

What is claimed is:

1. A method of manufacturing a dielectric ceramic composition for electronic devices wherein, when obtaining by sintering a dielectric ceramic composition for electronic devices of a composition whose basic composition is represented by: $X(Ba_Z.Sr_{1-Z})(Zn_{1/3}.(Ta_M.Nb_{1-M})_{2/3})O_3$—$Y(Ba_{Z'}.Sr_{1-Z'})(Ga_{1/2}.Ta_{1/2})O_3$ wherein the X, Y, Z, Z' and M that define the ranges in the composition satisfy the following values, sintering at 1400° C. to 1550° C. is performed in an $N_2$ atmosphere containing an oxygen concentration of 6% to 40%:

$X+Y=1, 0.3 \leq X \leq 1, 0.7 \geq Y \geq 0, 0 \leq Z \leq 1, 0 \leq Z' \leq 1, 0.2 \leq M \leq 0.8.$ 2. A method of manufacturing a dielectric ceramic composition for electronic devices wherein, when obtaining by sintering a dielectric ceramic composition for electronic devices of a composition whose basic composition is represented by: $X(Ba_Z.Sr_{1-Z})(Zn_{1/3}.(Ta_M.Nb_{1-M})_{2/3})O_3$—$Y(Ba_{Z'}.Sr_{1-Z'})(Ga_{1/2}.Ta_{1/2})O_3$ wherein the X, Y, Z, Z' and M that define the ranges in the composition satisfy the following values, sintering at 1400° C. to 1550° C. is performed in an $N_2$ atmosphere containing an oxygen concentration of 6% to 40% after pre-sintering at 900° C. to 1300° C.:

$X+Y=1, 0.3 \leq X \leq 1, 0.7 \geq Y \geq 0, 0 \leq Z \leq 1, 0 \leq Z' \leq 1, 0.2 \leq M \leq 0.8.$

* * * * *